(12) United States Patent (10) Patent No.: US 9,123,883 B2
Kurita (45) Date of Patent: Sep. 1, 2015

(54) VIBRATION DEVICE

(71) Applicant: SEIKO EPSON CORPORATION, Tokyo (JP)

(72) Inventor: Hideaki Kurita, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 334 days.

(21) Appl. No.: 13/849,952

(22) Filed: Mar. 25, 2013

(65) Prior Publication Data

US 2013/0249351 A1 Sep. 26, 2013

(30) Foreign Application Priority Data

Mar. 26, 2012 (JP) ................. 2012-069221

(51) Int. Cl.
*H01L 41/053* (2006.01)
*G01C 19/5621* (2012.01)

(52) U.S. Cl.
CPC ........ *H01L 41/0533* (2013.01); *G01C 19/5621* (2013.01)

(58) Field of Classification Search
CPC ................... G01C 19/5621; H01L 41/0533
USPC ................. 310/366, 367, 346, 348; 73/514.29
IPC ...................... H01I 41/053, 41/22; C01C 19/56
See application file for complete search history.

(56) References Cited

U.S. PATENT DOCUMENTS

| 2005/0284223 | A1 | 12/2005 | Karaki et al. |
| 2006/0107739 | A1 | 5/2006 | Ogura |
| 2006/0107740 | A1 | 5/2006 | Ogura |
| 2006/0162447 | A1 | 7/2006 | Ogura |
| 2011/0210408 | A1 | 9/2011 | Otsuki |
| 2012/0325000 | A1* | 12/2012 | Shimura et al. ............ 73/504.16 |
| 2013/0255387 | A1* | 10/2013 | Hanaoka ........................ 73/649 |

FOREIGN PATENT DOCUMENTS

| JP | A 2000-292174 | 10/2000 |
| JP | A 2003-166830 | 6/2003 |
| JP | A 2005-62160 | 3/2005 |
| JP | A 2006-201011 | 8/2006 |
| JP | A 2006-201053 | 8/2006 |
| JP | A 2006-201117 | 8/2006 |
| JP | A 2007-180900 | 7/2007 |
| JP | A 2009-300460 | 12/2009 |
| JP | A 2010-25945 | 2/2010 |
| JP | A 2010-503877 | 2/2010 |
| JP | A 2011-179941 | 9/2011 |
| WO | WO 2009/116523 | 9/2009 |

* cited by examiner

*Primary Examiner* — Thomas Dougherty
*Assistant Examiner* — Karen B Addison
(74) *Attorney, Agent, or Firm* — Oliff PLC

(57) ABSTRACT

A vibration device includes a semiconductor device, a first electrode and a second electrode located in a first surface of the semiconductor device, a vibration element, a third electrode and a fourth electrode located in a first surface of the vibration element, a first connection section that connects the first electrode and the third electrode, and a second connection section that connects the second electrode and the fourth electrode. The semiconductor device and the vibration element have mutually different thermal expansion coefficients. The vibration element has a coupling section located between the third electrode and the fourth electrode, and the coupling section has at least one bend section located between the third electrode and the fourth electrode.

6 Claims, 3 Drawing Sheets

VIBRATION DEVICE

BACKGROUND

1. Technical Field

The present invention related to vibration devices claims a priority based on Japanese Patent Application No. 2012-69221 filed on Mar. 26, 2012, the contents of which are incorporated herein by reference.

2. Related Art

As one example of vibration devices (sensors) that use a piezoelectric element, a vibration device that uses a vibration element as a sensor element is known. JP-A-2011-179941 describes a vibration device having a drive circuit element with electrodes provided thereon to drive a vibration element. The vibration device is configured in a manner that the electrodes on the drive circuit element and electrodes provided on the vibration element are connected with one another, and the vibration element is arranged superposed on the drive circuit element.

However, because the thermal expansion coefficient (expansion coefficient and contraction coefficient) of the driving circuit element is different from that of the vibration element arranged superposed on the driving circuit element, there is a possibility that force may be applied to the connection part between the driving circuit element and the vibration element due to changes in temperature of the vibration device and changes in ambient temperature of the vibration device, and the connection part might be damaged.

SUMMARY

The invention has been made to solve at least a part of the problem described above, and can be realized by embodiments or application examples to be described below.

Application Example 1

In accordance with Application Example 1 of the invention, a vibration device has a semiconductor device, a first electrode and a second electrode located in a first surface of the semiconductor device, a vibration element, a third electrode and a fourth electrode located in a first surface of the vibration element, a first connection section that connects the first electrode and the third electrode, and a second connection section that connects the second electrode and the fourth electrode. The thermal expansion coefficient of the semiconductor device and the thermal expansion coefficient of the vibration element are different from each other. The vibration element has a coupling section located between the third electrode and the fourth electrode, and the coupling section has at least one bend located between the third electrode and the fourth electrode.

In such a vibration device, the semiconductor device and the vibration element have different thermal expansion coefficients to temperature change because of the difference in the base materials with which they are formed. According to the vibration device of the present application example, stress that is generated in the first connection section and the second connection section when the semiconductor device and the vibration element thermally expand due to changes in temperature can be absorbed by the bend in the coupling section that is located in the vibration element. As a result, damage to the first connection section and the second connection section that connect the semiconductor device and the vibration element can be suppressed.

Moreover, because the vibration device has the coupling section having the bend between the third electrode and the fourth electrode located in the vibration element connected with the semiconductor device through the first connection section and the second connection section, the stress caused between the third electrode and the fourth electrode can be absorbed by the bend provided in the coupling section. As a result, stress in the vibration element that may be generated when it thermally expands due to change in temperature, etc. can be absorbed by the coupling section, such that damage to the vibration element can be suppressed.

Therefore, according to the vibration device of the application example, it is possible to suppress damage to the vibration element and the first connection section and the second connection section by which the vibration element and the semiconductor device are connected together, which may be caused by changes in temperature, and therefore changes in ambient temperature for which the vibration device is used can be more readily accommodated, and the reliability can be improved.

Application Example 2

The vibration device in accordance with an aspect of the application example described above may preferably be provided with a first protruded electrode located between the first electrode and the third electrode, and a second protruded electrode located between the second electrode and the fourth electrode.

According to the vibration device describe above, a space is created between the semiconductor device and the vibration element, because the semiconductor device and the vibration element are connected together through the first protruded electrode and the second protruded electrode, and an integrated circuit, etc. that drives the vibration element can be arranged in the space. As a result, the vibration element can be arranged superposed over the semiconductor device, and thus the vibration device can be reduced in size. Moreover, according the vibration device of the application example, the space is created between the semiconductor device and the vibration element, and the space allows some deformation that may be generated when the semiconductor device and the vibration element thermally expand.

Application Example 3

In the vibration device in accordance with an aspect of the application example described above, the vibration element may preferably be provided with a vibration section, a base section connected with the vibration section, a support section where the third electrode to be connected with a beam section extending from the base is located, and a fixed section that connects to the support section through the coupling section, and where the fourth electrode is located. In an aspect, at least one bend is provided in a coupling section that connects the support section and the fixed section.

Application Example 4

In the vibration device in accordance with an aspect of the application example described above, the third electrode and the fourth electrode may preferably be arranged next to each other in the vibration element.

In the vibration device, the semiconductor device and the vibration element have different thermal expansion coefficients to temperature change because of the difference in the base materials with which they are formed. According to the vibration device of the present application example, stress that is generated in the first connection section and the second connection section when the vibration element and the semiconductor device thermally expand due to changes in temperature can be absorbed by the bend in the coupling section that is located the vibration element. As a result, damage to the first connection section and the second connection section that connect the semiconductor device and the vibration element can be suppressed.

Furthermore, according to the vibration device, the support section where the third electrode is provided and the beam is connected and the fixed section where the fourth electrode is provided and the vibration element is fixed are arranged adjacent to each other, and connected together through the coupling section having the bend, whereby stress generated between the support section and the fixed section can be absorbed by the bend provided in the coupling section. As a result, stress generated in the vibration element generated due to thermal expansion caused by change in temperature, etc. can be absorbed by the coupling section, and damage to the vibration element can be suppressed.

Also, because the support section where the beam is connected and the fixed section where the vibration element is fixed are connected together through the coupling section having the bend, leaking of vibration of the vibration section from the support section to the fixed section, and propagation of vibration from the fixed section to the vibration section through the support section can be suppressed, and error detection of acceleration and angular velocity can be suppressed.

Therefore, according to the vibration device of the present application example, damage to the vibration element and the first connection section and the second connection section where the semiconductor device and the vibration element are connected, which may be caused by changes in temperature, can be suppressed, leakage of vibration from the vibration section and propagation of vibration from the outside can be suppressed, and the reliability in detection of acceleration, angular velocity, etc. can be improved.

Application Example 5

In the vibration device in accordance with the application example described above, the coupling section may have the bend in a plan view of the vibration element, in other words, in a plane transverse to a thickness direction of the vibration element.

Application Example 6

In the vibration device in accordance with the application example described above, the coupling section may have the bend in a thickness direction of the vibration element.

According to the vibration device described above, the bend in the coupling section is provided in a thickness direction or in a plan view of the vibration element, whereby damage to the first connection section and the second connection section between the semiconductor device and the vibration element, and dame to the vibration element can be suppressed.

DESCRIPTION OF EXEMPLARY EMBODIMENTS

Embodiments of the invention will be described with reference to the accompanying drawings. In each of the drawings, the size and the ratio of each component may be illustrated different from those of an actual component as needed, so that each of the components assumes the size to the extent that they can be recognized on the drawings. Moreover, an XYZ orthogonal coordinate system is set in each of the drawings, and the relative position of each component will be described referring to the XYZ orthogonal coordinate system. A predetermined direction in a vertical plane is assumed to be an X-axis direction, a direction orthogonal to the X axis direction in the vertical plane is assumed to be a Y-axis direction, and a direction perpendicular to both of the X-axis direction and the Y-axis direction is assumed to be a Z-axis direction. Also, when the direction of gravity is set as reference, the direction of gravity is assumed to be a downward direction and its opposite direction is assumed to be an upward direction.

A vibration device of the present embodiment is a sensor equipped with a vibration element for detecting acceleration and angular velocity. The vibration device includes a semiconductor device where a drive circuit element is located. For reducing the size of the vibration device, the vibration element is provided superposed over a first surface that is an active surface of the semiconductor device. The vibration device in accordance with an embodiment of the invention is described below.

First Embodiment

Figure 1A:
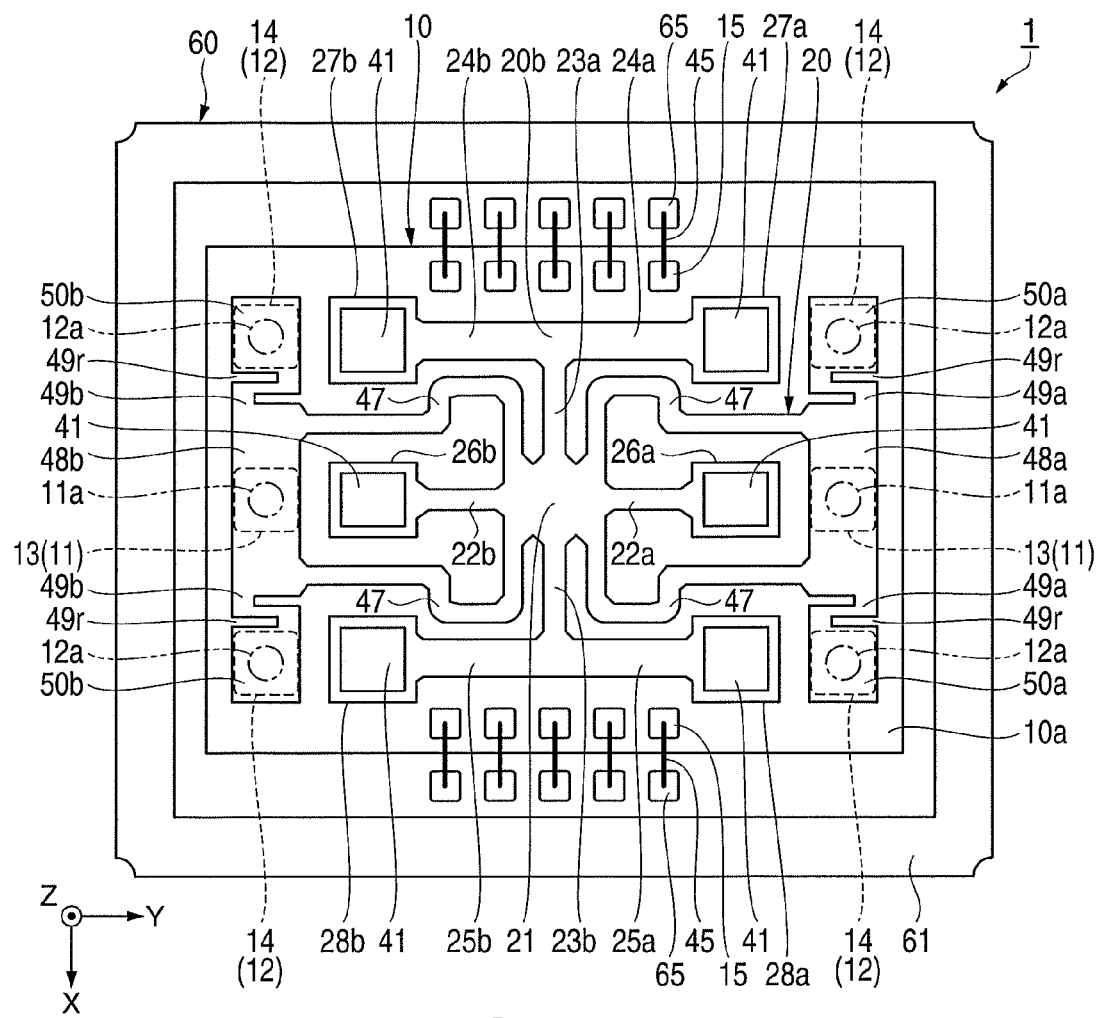
FIGS. 1A and 1B are schematic views of a vibration device in accordance with a first embodiment of the invention.
Figure 1B:
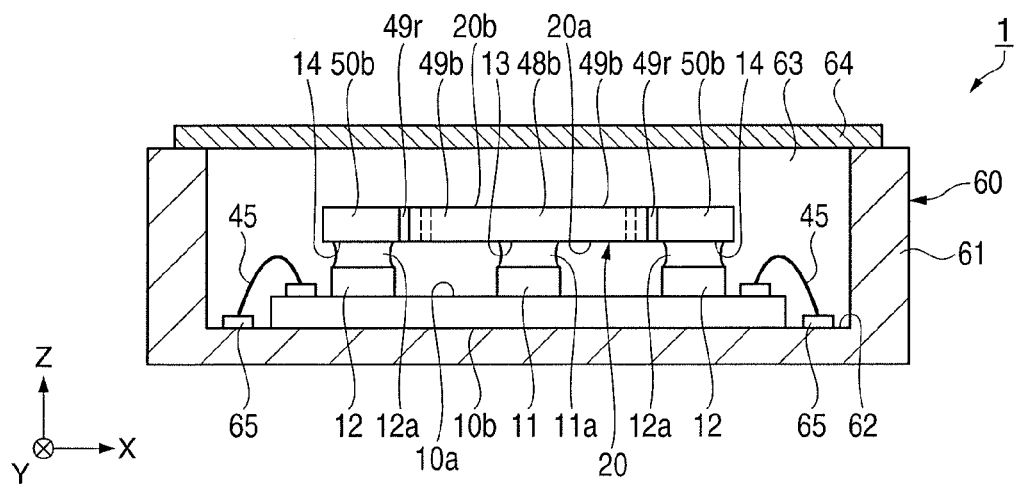

FIGS. 1A and 1B show a vibration device 1 in accordance with the embodiment. FIG. 1A is a view schematically showing the configuration of the vibration device 1, and is a plan view of the vibration device 1. FIG. 1B is a side view in which the vibration device 1 in FIG. 1A is seen in the Y-axis direction. For convenience of description, a lid 64 on a package 60 that contains a semiconductor device 10 and a vibration element 20 is omitted in FIG. 1A, and a side surface 61 of the package 60 is also omitted in FIG. 1B.

A vibration device 1 of the embodiment has a semiconductor device 10, a vibration element 20, and a package 60 where the semiconductor device 10 and the vibration element 20 are contained. As shown in FIGS. 1A and 1B, the vibration element 20 is arranged in a manner to be superposed over an active surface 10a that is a first surface of the semiconductor device 10.

The vibration element 20 of the embodiment is formed from quartz crystal that is a piezoelectric material as a base material (a material that composes the main portion thereof). Quartz crystal has X axis that is called an electric axis, Y axis that is called a mechanical axis, and Z axis that is called an optical axis. The vibration element 20 is cut out along a plane defined by the X axis and the Y axis orthogonal to each other in the crystal axis of the quartz crystal, is processed into a plate shape, and has a predetermined thickness in the Z axis direction orthogonal to the plane. The predetermined thickness is suitably set depending on the oscillation frequency (resonance frequency), the external size, the processability, etc. Though the vibration element 20 of the embodiment uses quartz crystal, other piezoelectric materials (for instance, lithium tantalate, lead zirconate titanate, etc.) may be used as the base material.

The vibration element 20 is formed by etching using photolithography technique (wet etching or dry etching).

As shown in FIGS. 1A and 1B, the vibration element 20 is arranged in a manner to be superposed over the semiconductor device 10 on the side of the active surface 10a of the semiconductor device 10, as seen in a plan view (in the Z-axis direction) as described above. Note that a surface of the vibration element 20 where third electrodes 13 and fourth electrodes 14 to be connected with first electrodes 11 and second electrodes 12 of the semiconductor device 10 to be described later is referred to as a main surface 20a, which is the first surface of the vibration element 20. On the other hand, the other surface opposite to the main surface 20a is referred to as a sub-surface 20b.

In the vibration element 20, the third electrodes 13 and the fourth electrodes 14 are provided in the main surface 20a of the vibration element 20 arranged opposite the active surface 10a of the semiconductor device 10. The third electrodes 13 are provided on support sections 48a and 48b, and connected to the first electrodes 11 of the semiconductor device 10 through first connection sections 11a. The fourth electrodes 14 are provided on fixed sections 50a and 50b, and are connected to the second electrodes 12 of the semiconductor device 1 through second connection sections 12a.

The vibration element 20 of the embodiment has a configuration called a double-T type. The vibration element 20 has a base 21 located in the center part thereof, a pair of vibration arms for detection 22a and 22b as vibration sections that extend along the Y axis from the base 21, and a pair of coupling arms 23a and 23b that extend from the base section 21 along the X axis, orthogonal to the vibration arms for detection 22a and 22b. Also, the vibration element 20 is equipped with a pair of vibration arms for driving 24a and 24b and a pair of vibration arms for driving 25a and 25b as driving sections that extend along the Y axis from the tip side of the coupling arms 23a and 23b, respectively, in parallel with the vibration arms for detection 22a and 22b. Further, the vibration element 20 is equipped with a plurality of beam sections 47 extending along the Y axis from the base section 21, and two support sections 48a and 48b extending from the beam sections 47. Moreover, the vibration element 20 is equipped with coupling sections 49a and 49b between the support sections 48a and 48b, and the fixed sections 50a and 50b. The support sections 48a and 48 are connected with the fixed sections 50a and 50b through the coupling sections 49a and 49b.

Bend sections 49r (in S-letter shape, for example) are provided in the coupling sections 49a and 49b as seen in a direction in which the vibration element 20 is viewed in a plan view in the Z axis direction. The bend sections 49r that consist of gaps are formed in the base material forming the vibration element 20 in the coupling sections 49a and 49b, whereby the movability is secured between the support part 48a and 48b and the fixed sections 50a. In other words, the bends 49r provide gaps in a direction in which the Z axis extends. Moreover, the bends 49r are formed by etching using a photolithography technique (wet etching or dry etching), similar to the formation of the vibration element 20. Note that the number of the bends 49r provided in the coupling sections is not limited to two as illustrated, but may be suitably decided.

A detection vibration system, that detects acceleration, angular velocity, etc. with the vibration arms for detection 22a and 22b, is formed in the vibration element 20. Also, a drive vibration system, that drives the vibration element 20, is formed with the coupling arms 23a and 23b, and the vibration arms for driving 24a, 24b, 25a, and 25b.

The vibration element 20 is also provided with weight sections 26a and 26b each having a wider section corresponding to the tip section of each of the vibration arms for detection 22a and 22b. Similarly, weight sections 27a, 27b, 28a and 28b each having a wider section at the tip of each of the respective vibration arms for driving 24a, 24b, 25a and 25b are formed. Weight electrodes 41 as mass adjusting sections are formed on the surface of the respective weight sections 26a, 26b, 27a, 27b, 28a and 28b. The weight electrodes 41 formed on the weight sections 26a, 26b, 27a, 27b, 28a and 28b are used for adjusting the frequency of the vibration element 20.

The semiconductor device 10 shown in FIG. 1 has an active surface 10a where an integrated circuit (not shown) equipped with electronic parts such as transistors, diodes and the like, and circuit wirings is provided. The integrated circuit formed on this active surface 10a includes a drive circuit element to vibrate and drive the vibration element 20 and a detection circuit element that detects detected vibration caused in the vibration element 20 when acceleration, angular velocity, etc. are applied. For example, when the vibration element 20 is formed from quartz crystal as the base material, the semiconductor device 10 may be formed from silicon (Si) as the base material. More specifically, on the side where the electronic parts are formed on the silicon substrate that is composed of silicon, the semiconductor device 10 including circuit wirings connected to the electronic parts and multiple layers of dielectric films laminated between the circuit wirings may be formed. Note that the thermal expansion coefficient of the semiconductor device 10 is different from the thermal expansion coefficient of the vibration element 20.

The semiconductor device 10 is provided with the first electrodes 11 and the second electrodes 12 arranged on the side of the active surface 10a. The first electrodes 11 and the second electrodes 12 are conductively connected to the integrated circuit arranged on the semiconductor device 10. Moreover, connection terminals 15 are provided on the semiconductor device 10. The connection terminals 15 are connected through wirings 45 to external wiring electrodes 65 disposed on the package 60 in which the vibration element 20 is contained.

First connection sections 11a are provided on the first electrodes 11, as shown in FIGS. 1A and 1B. The first connection sections 11a define first protruded electrodes formed from gold (Au) stud bumps, for example. The first connection sections 11a can be formed with other electroconductive materials, such as, copper, aluminum, solder balls, etc. besides the gold stud bumps. Also, the first connection sections 11a can be formed with electroconductive adhesive that mixes electroconductive filler, such as, silver powder, copper powder, etc. and synthetic resin, etc. Note that second connection sections 12a formed of second protruded electrodes made of gold stud bumps or the like, and electroconductive adhesive are formed on the second electrodes 12 in a similar manner as the first electrodes 11.

In such a composition, the vibration element 20 is electrically connected to the integrated circuit formed on the semiconductor device 10 through the first electrodes 11, the second electrodes 12, the first connection sections 11a and the second connection sections 12a. Moreover, as a result of the first protruded electrodes and the second protruded electrodes being provided, a space can be secured between the semiconductor device 10 and the vibration element 20, and the integrated circuit, etc. that drives the vibration element 20 can be provided on the active surface 10a.

Connection terminals 15 are connected by wirings 45 that are connection members such as bonding wires made of metal such as for example gold (Au), aluminum (Al), etc. to the external wiring electrodes 65 provided on the package 60. Moreover, other electrodes (not shown in the figure) besides the first electrodes 11 and the second electrodes 12 are provided on the integrated circuit arranged in the semiconductor device 10. These other electrodes are connected with wirings not shown in the figure, and connected with the connection terminals 15 through these wirings. Note that the present embodiment example has been described, referring to the composition that uses the wirings 45 such as bonding wires to connect the connection terminals 15 and the external wiring electrodes 65. However, a flexible wiring substrate (FPC: Flexible Printed Circuits) may be used for connection (wiring) instead of the wirings 45.

An insulation surface 10b of the semiconductor device 10 on the opposite side of the active surface 10a is bonded (connected) to a bottom 62 of the package 60 with a connection member such as adhesives not shown in the figure. The package 60 is formed with a nonconductive material, such as, for example, ceramics, and external wiring electrodes 65 are provided on the bottom 62 to be connected with the semiconductor device 10. The external wiring electrodes 65 are connected to the connection terminals 15 by the wirings 45 formed on the semiconductor device 10, as described above.

Note that the package 60 has side surfaces 61 (sidewalls) at its periphery, and has a concave accommodation space 63 in the center section thereof. The semiconductor device 10 and the vibration element 20 accommodated in the package 60 are sealed airtight by the lid 64.

Operation of Vibration Device

Figure 2A:
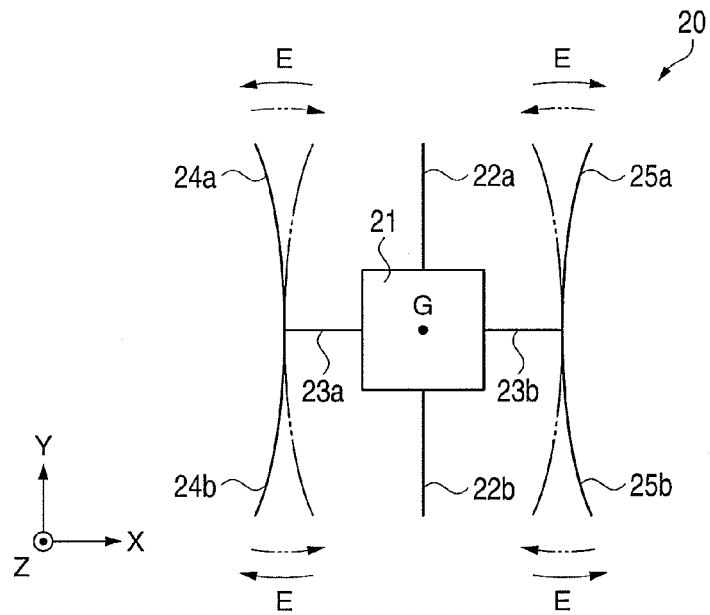
FIGS. 2A, 2B and 2C are schematic diagrams showing movements of a vibration element composing the vibration device of the first embodiment.
Figures 2B, 2C:
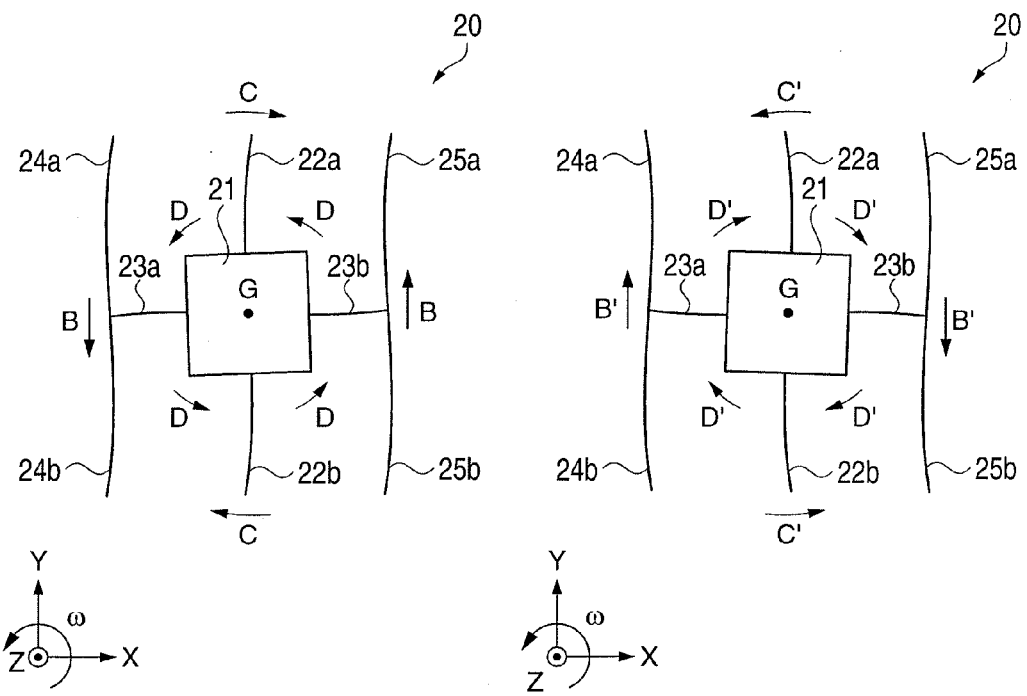

The operation of the vibration element 20 of the vibration device 1 will be described below. FIGS. 2A-2C are schematic plan views showing the operation of the vibration element 20 that composes the vibration device 1. FIG. 2A shows a state of drive vibration, and FIGS. 2B and 2C show states of detected vibration when acceleration, angular velocity, etc. are applied. In FIGS. 2A-2C, the vibration arms are shown by lines, and illustration of the beams 47, the support sections 48a and 48b, the connection sections 49a and 49b, the fixed sections 50a and 50b is omitted, for simply representing the states of vibration.

Referring to FIG. 2A, the state of driving vibration of the vibration element 20 is explained. First, when a drive signal is impressed to the vibration element 20 from the integrated circuit (a drive circuit) provided in the semiconductor device 10, flexural vibration is generated in the vibration arms for driving 24a, 24b, 25a and 25b in directions indicated by arrows E, in a state where no acceleration or angular velocity is given to the vibration element 20. The flexural vibration repeats a vibration state shown by a solid line and a vibration state shown by a two-dot-and-dash line with a predetermined frequency (cycle).

Next, while the driving vibration is occurring, if an angular velocity w around the Z axis is applied to the vibration element 20, the vibration element 20 vibrates as the vibration arms for driving 24a, 24b, 25a and 25b flex in a manner shown in FIG. 2B and FIG. 2C. First, as shown in FIG. 2B, the Coriolis force in the direction of arrows B acts on the vibration arms for driving 24a, 24b, 25a and 25b, and the coupling arms 23a and 23b, which compose the driving vibration system. At the same time, the vibration arms for detection 22a and 22b flex (deform) in the direction of arrows C in response to the Coriolis force.

Then, a returning force in the direction of arrows B' act on the vibration arms for driving 24a, 24b, 25a and 25b, and the coupling arms 23a and 23b, as shown in FIG. 2C. At the same time, the vibration arms for detection 22a and 22b flex (deform) in the direction of arrows C' in response to the force. New vibration is excited in the vibration element 20 as it alternately repeats a series of these motions. Note that the vibration in the direction of arrows D and D' is vibration in a circumferential direction about the center of gravity G. Then, the vibration device 1 detects, with a detection electrode (not shown in FIG. 1) provided on the vibration arms for detection 22a and 22b, the distortion of the quartz crystal (a piezoelectric material), that is the base material of the vibration element 20, generated by the vibration, and obtains an angular velocity.

The following effect can be obtained by the first embodiment described above. According to the vibration device 1, the support sections 48a and 48b where the third electrodes 13 are provided and the fixed sections 50a and 50b where the fourth electrodes 14 are provided are arranged next to one another, and connected through the coupling sections 49a and 49b having the bend sections 49r. Moreover, the semiconductor device 10 and the vibration element 20 to be connected have different coefficients of thermal expansion to temperature change because these elements are formed from different base materials. As a result, when the semiconductor device 10 and the vibration element 20 thermally expand due to temperature changes, the vibration device 1 can absorb stress generated at the first connection sections 11a and the second connection sections 12b by flexing the bend sections 49r provided in the coupling sections 49 located in the vibration element 20. Therefore, damage to the first connection sections 11a and the second connection sections 12b where the semiconductor device 10 and the vibration element 20 are connected can be suppressed.

Moreover, as a result, the vibration device 1 can absorb stress caused between the support sections 48a and 48b and the fixed sections 50a and 50b of the vibration element 20 by flexing the bend sections 49r provided in the coupling sections 49a and 49b. Therefore, stress generated when the vibration element 20 thermally expands (expands or contracts) due to changes in the temperature or the like can be absorbed by the coupling sections 49a and 49b, and damage to the vibration element 20 can be suppressed.

Also, according to the vibration device 1, the semiconductor device 10 and the vibration element 20 are joined together through the first protruded electrodes as the first connection sections 11a and the second protruded electrodes as the second connection sections 12a, such that a space is created between the semiconductor device 10 and the vibration element 20, and the drive circuit element and the like for driving the vibration element 20 can be accommodated in the space. As a result, in the vibration device 1, the vibration element 20 can be provided in a manner superposed over the semiconductor device 10, and thus the vibration device 1 can be miniaturized.

Moreover, the vibration device 1 is provided with a space between the semiconductor device 10 and the vibration element 20, such that the space can allow some deformation generated when the semiconductor device 10 and the vibration element 20 have thermal expansion. As a result, when the semiconductor device 10 and the vibration element 20 thermally expand due to changes in temperature, the vibration device 1 can control damage that may be caused by interference between the semiconductor device 10 and the vibration element 20.

Also, in the vibration device 1, because the support sections 48a and 48b and the fixed sections 50a and 50b are connected together through the coupling sections 49a and 49b, leaking of vibration from the vibration section to the fixed sections 50a and 50b through the beam sections 47 can be suppressed. As a result, error detection of acceleration and angular velocity applied to the vibration device 1 can be controlled. Therefore, by the vibration device 1, reliability in detecting acceleration and angular velocity can be improved.

Second Embodiment

Figure 3A:
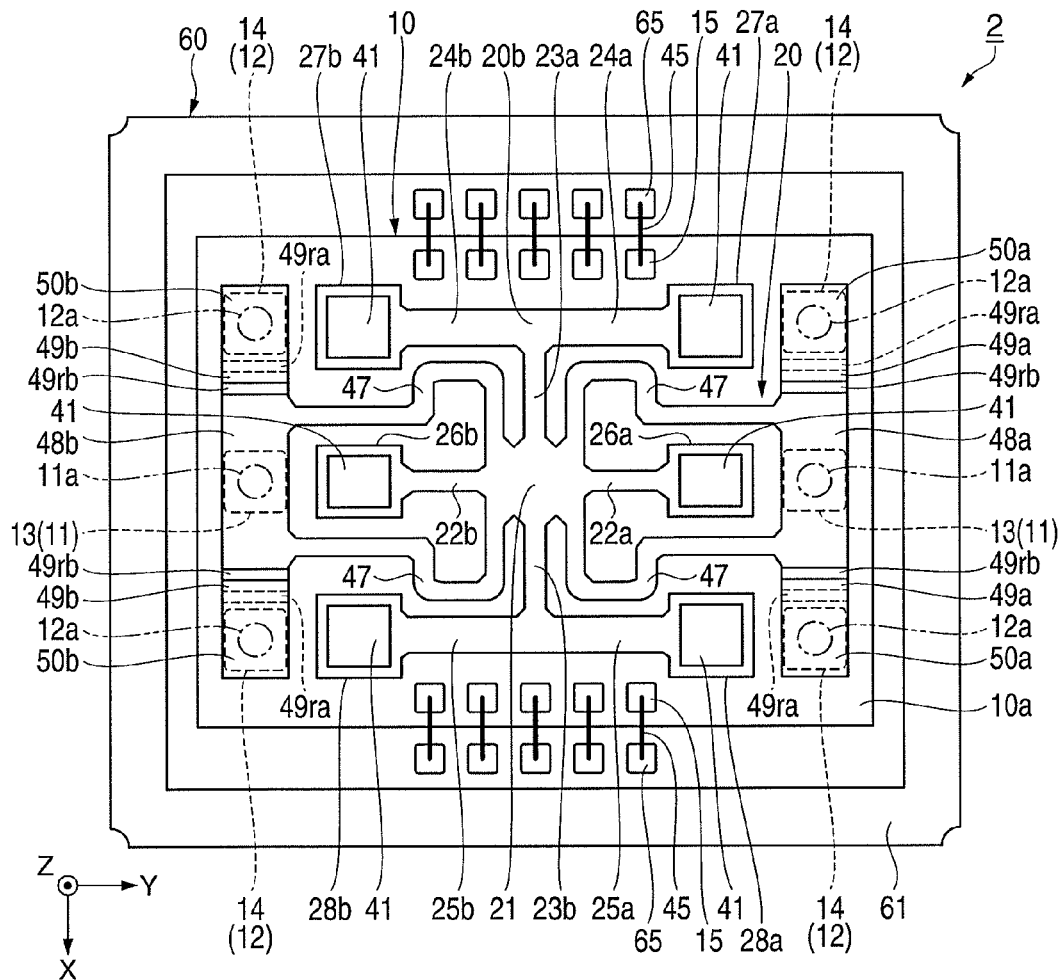
FIGS. 3A and 3B are schematic views of a vibration device in accordance with a second embodiment of the invention.
Figure 3B:
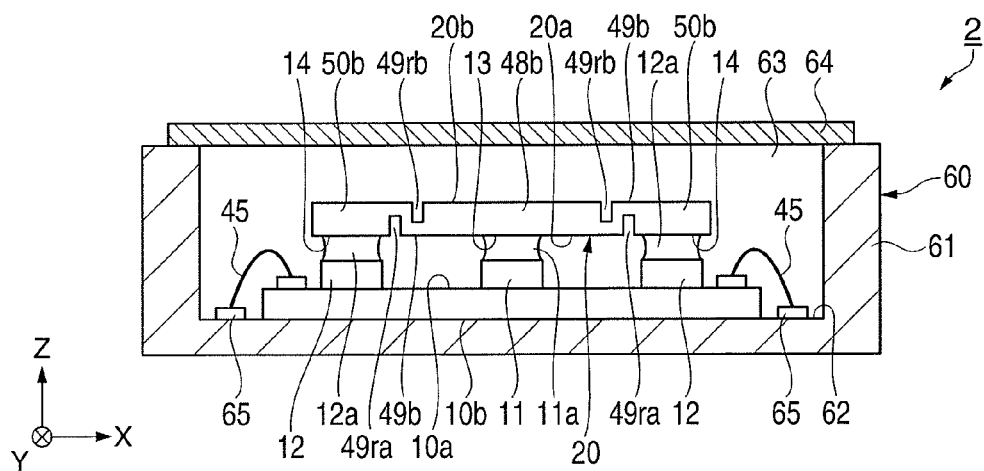

A vibration device in accordance with a second embodiment of the invention will be described. A vibration device 2 of the present embodiment is shown in FIGS. 3A and 3B. FIG. 3A is a view schematically showing the configuration of the vibration device 2, and is a plan view of the vibration device 2. FIG. 3B is a side view in which the vibration device 2 is seen in the Y-axis direction. For convenience of description, a lid 64 on a package 60 is omitted in FIG. 3A, and a side surface 61 of the package 60 is also omitted in FIG. 3B. Note that the vibration device 2 of the present embodiment is different from the vibration device 1 of the first embodiment described above in that bend sections 49ra and 49rb in the coupling sections 49a and 49b have a different shape. Other parts of the configuration are similar to the first embodiment, and therefore they are appended with similar reference numerals, and their description may be omitted or briefly made.

The vibration device 2 of the present embodiment is equipped with a semiconductor device 10, a vibration element 20, and a package 60 in which the semiconductor device 1 and the vibration element 20 are contained. As shown in FIGS. 3A and 3B, the vibration element 20 is arranged in a manner to be superposed over an active surface 10a that is a first surface of the semiconductor device 10.

The vibration element 20 is formed from quartz crystal as a base material, similarly to the vibration device 1, and is equipped with a base section 21, vibration arms for detection 22a and 22b as vibration sections, coupling arms 23a and 23b, and vibration arms for driving 44a, 24b, 25a and 25b. Moreover, the vibration element 20 has beam sections 47, support sections 48a and 48b, coupling sections 49a and 49b, and fixed sections 50a and 50b.

The vibration element 20 of the vibration device 2 is different from the vibration element 20 of the vibration device 1 of the first embodiment described above in that the shape of the bend sections 49ra and 49rb in the coupling sections 49 of the vibration element 20 is different from those of the first embodiment.

The coupling sections 49a and 49b are provided with the bend sections 49ra and 49rb (in an L-letter shape, for example) as seen in a direction in which the vibration element 20 is viewed from the side in the Y axis direction (the thickness direction of the vibration element 20). The coupling sections 49a and 49b are formed with the bend sections 49ra and 49rb, which define gaps in the base material composing the vibration element 20, whereby the movability between the support sections 48a and 48b and the fixed section 50a and 50b is secured. In other words, the bend sections 49ra and 49rb defining gaps are formed in a direction in which the Y axis extends. Moreover, the bend sections 49ra and 49rb are formed by etching (wet etching or dry etching) of the vibration element 20, using a photolithography technique. For example, the bend sections 49ra and 49rb may be formed by a process of half-etching the vibration element 20 from the side of the main surface 20a to form recessed sections 49ra, and a process of half-etching the vibration element 20 from the side of the sub-surface 20b to form recessed sections 49rb. Note that the number of the bends 49ra and 49rb provided in the coupling sections is not limited to two as illustrated, but may be suitably decided.

Other parts of the configuration are generally the same as those of the vibration device 1 of the first embodiment described above, and therefore their description is omitted.

According to the vibration device 2, the following effects can be achieved. According to the vibration device 2, the bend sections 49ra and 49rb in the coupling sections 49a and 49b are provided in the Y axis direction that is the thickness direction of the vibration element 20, whereby damage to the first connection sections 11a and the second connection sections 12b which may be caused by thermal expansion of the semiconductor device 10 and the vibration element 20, and damage to the vibration element 20 can be suppressed. Therefore, according to the vibration device 2 (or the vibration device 1), by providing the bend sections 49ra and 49rb in the coupling sections 49a and 49b in either of the directions, damage to the vibration device 2 can be suppressed, and reliability in detecting acceleration and angular velocity can be improved.

What is claimed is:

1. A vibration device comprising:
a semiconductor device;
a first electrode and a second electrode located in a first surface of the semiconductor device;
a vibration element;
a third electrode and a fourth electrode located in a first surface of the vibration element;
a first connection section that connects the first electrode and the third electrode; and
a second connection section that connects the second electrode and the fourth electrode,
the semiconductor device and the vibration element having different thermal expansion coefficients,
the vibration element having a coupling section located between the third electrode and the fourth electrode, and
the coupling section having at least one bend section located between the third electrode and the fourth electrode.

2. A vibration device according to claim 1, comprising a first protruded electrode located between the first electrode and the third electrode, and a second protruded electrode located between the second electrode and the fourth electrode.

3. A vibration device according to claim 1, wherein the vibration element includes:
a vibration section;
a base section connected with the vibration section;
a support section that connects to a beam section extending from the base, and where the third electrode is located;
a fixed section that connects to the support section through the coupling section, and where the fourth electrode is located; and
at least one bend provided in a coupling section that connects the support section and the fixed section.

4. A vibration device according to claim 1, wherein the third electrode and the fourth electrode are arranged next to each other in the vibration element.

5. A vibration device according to claim 1, wherein the coupling section has the bend in a plan view of the vibration element.

6. A vibration device according to claim 1, wherein the coupling section has the bend in a thickness direction of the vibration element.

* * * * *